United States Patent [19]

Kiuchi et al.

[11] 4,376,265
[45] Mar. 8, 1983

[54] POWER SOURCE VOLTAGE CHECKING DEVICE PARTICULARLY FOR CHECKING THE VOLTAGE OF A BATTERY IN A CAMERA

[75] Inventors: Masayoshi Kiuchi; Masanori Uchidoi, both of Yokohama; Hiroyasu Murakami, Tokyo, all of Japan

[73] Assignee: Canon Kabushiki Kaisha, Tokyo, Japan

[21] Appl. No.: 185,608

[22] Filed: Sep. 9, 1980

[30] Foreign Application Priority Data

Sep. 12, 1979 [JP] Japan .................................. 54-117494

[51] Int. Cl.³ ............................................ G01N 27/42
[52] U.S. Cl. .................................... 324/426; 324/433; 324/436
[58] Field of Search ................ 324/433, 436, 426, 425

[56] References Cited

U.S. PATENT DOCUMENTS

| | | | |
|---|---|---|---|
| 3,196,357 | 7/1965 | Hoag | 324/436 |
| 4,163,193 | 7/1979 | Kamiya | 324/436 |
| 4,258,999 | 3/1981 | Tominaga | 324/433 |

Primary Examiner—Michael J. Tokar
Attorney, Agent, or Firm—Toren, McGeady and Stanger

[57] ABSTRACT

In the disclosed device, a signal forming circuit produces a signal having a frequency corresponding to the voltage of a power source. A level detector detects the level of the voltage of the power source and is arranged to produce a signal when the voltage of the power source drops below a predetermined level. A control circuit coupled to the signal forming circuit is arranged to change the frequency of the signal produced by the signal forming circuit in response to the signal produced by the detector. An indicator operates at the frequency of the signal produced by the signal forming circuit. In a specific embodiment, a detector detects whether the voltage of a battery is at and below a first level, between the first level and a second higher level, and at and higher than the second level. A signal former responds to the detector for producing a first signal having a frequency below a first frequency when the voltage is below the second level, a second signal having a frequency twice the first frequency when the voltage is at the second level, and a signal having a frequency higher than the frequency of the second signal when the voltage is above the second level. An indicator responds to the signal former to operate at the frequency of the signal former.

14 Claims, 8 Drawing Figures

F I G. 1(b)
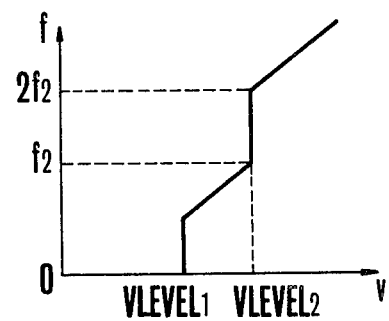
F I G. 2
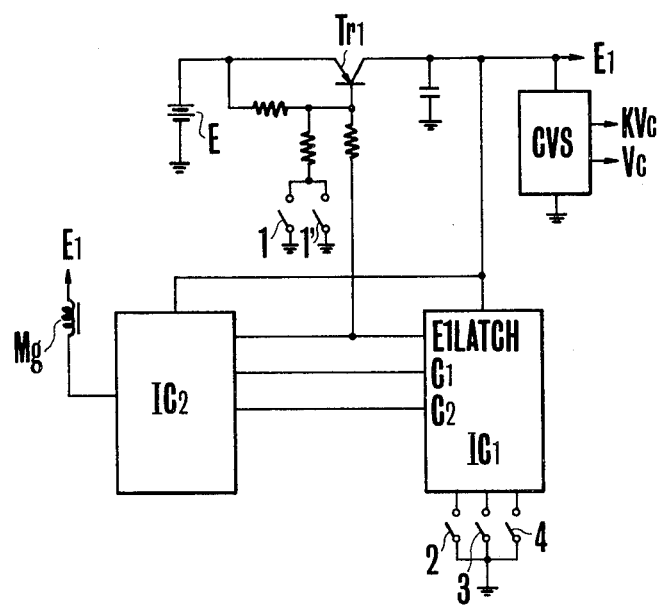

POWER SOURCE VOLTAGE CHECKING DEVICE PARTICULARLY FOR CHECKING THE VOLTAGE OF A BATTERY IN A CAMERA

BACKGROUND OF THE INVENTION

1. Field of the Invention

This invention relates to a battery check device.

2. Description of the Prior Art

In conventionally known battery check devices, a display such as formed by a light emitting diode operates at a frequency corresponding to the voltage of a power source such as a battery. In such a conventional device, the frequency at which the display operates changes continuously relative to the battery voltage. However, because the residual capacity of the voltage V of the power source relative to the operating frequency f is as shown in FIG. 1(a), it is difficult to display the residual capacity of the battery clearly.

SUMMARY OF THE INVENTION

It is therefore a general object of the invention to provide a battery check device which is capable of clearly displaying the residual voltage capacity of a power source by continuously varying a display element driving frequency in relation to the voltage of the power source battery and by arranging the display element driving frequency to be varied in a stepwise manner when the residual capacity of the power source becomes lower than a predetermined level.

In accordance with the invention, while the display frequency f is arranged to continuously vary according to the power source voltage capacity, the display frequency is arranged to come to vary in a stepwise manner when the residual capacity of the power source becomes lower than a predetermined level VLEVEL2 as shown in the accompanying drawing FIG. 1(b).

The above and further objects, features and advantages of the invention will become apparent from the following detailed description of the embodiments thereof taken in connection with the accompanying drawings.

BRIEF DESCRIPTION OF THE DRAWINGS

FIG. 1(b) is a wave form chart showing the operation of the battery check device of the present invention.

FIG. 2 is a circuit diagram showing a camera to which a battery check device is applied as embodiment of the present invention.

DESCRIPTION OF THE PREFERRED EMBODIMENTS

In FIG. 2 which is a circuit diagram showing a camera having a battery check device embodying the present invention, the camera is provided with a power source E; a power supply transistor Tr1; a constant voltage circuit CVS which is arranged to produce predetermined voltages KVc and Vc; a logic integrated circuit IC1 which will be described hereinafter; a computing integrated circuit IC2 which is arranged to perform computation and control as will be described hereinafter; an aperture controlling magnet, i.e., electromagnet, Mg which has its power supply thereto controlled by the computing integrated circuit IC2, the magnet being arranged to drive an aperture control device which is not shown but is arranged to control an aperture when the magnet is energized; a switch 1 which is arranged to be turned on at the first step when a shutter button is depressed and is connected to the base of the power supply transistor Tr1 to turn on the transistor Tr1 when the switch 1 is turned on; another switch 2 which is arranged to be turned on by the second step during operation of the shutter button; a switch 3 which is interlocked with the rear screen of the shutter, not shown, and is arranged to be turned on when the rear shutter screen runs and to be turned off upon completion of winding of the shutter; and a battery check switch 4 which is arranged to be turned on by the depression of a battery check button which is not shown. There is also provided a switch 1' which is arranged to turn on and off according as the battery check switch 4 is operated.

Figure 3:
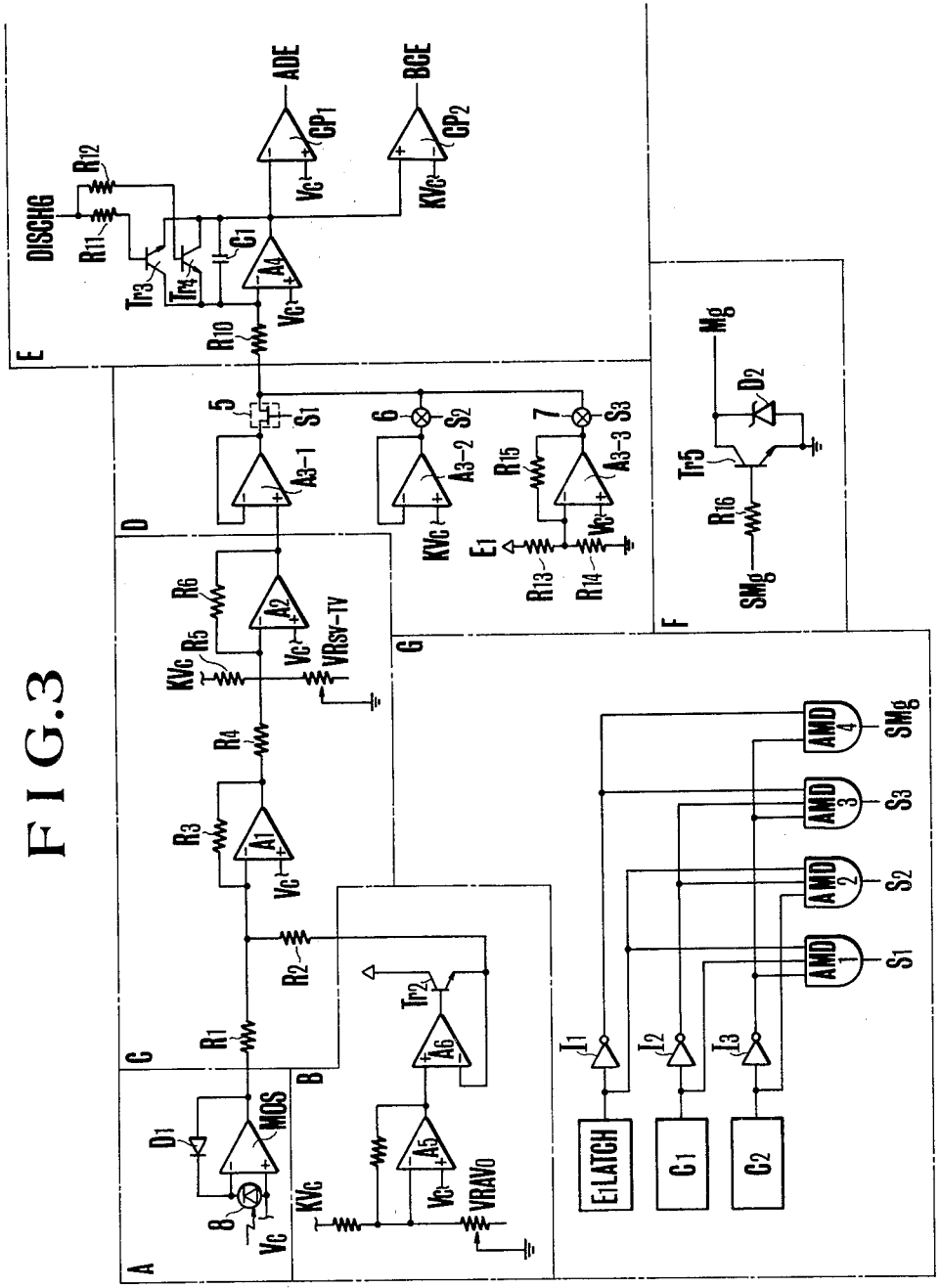
FIG. 3 is a circuit diagram showing the arrangement of the light measuring and computing part in a computing control integrated circuit shown in FIG. 2.
Figure 4:
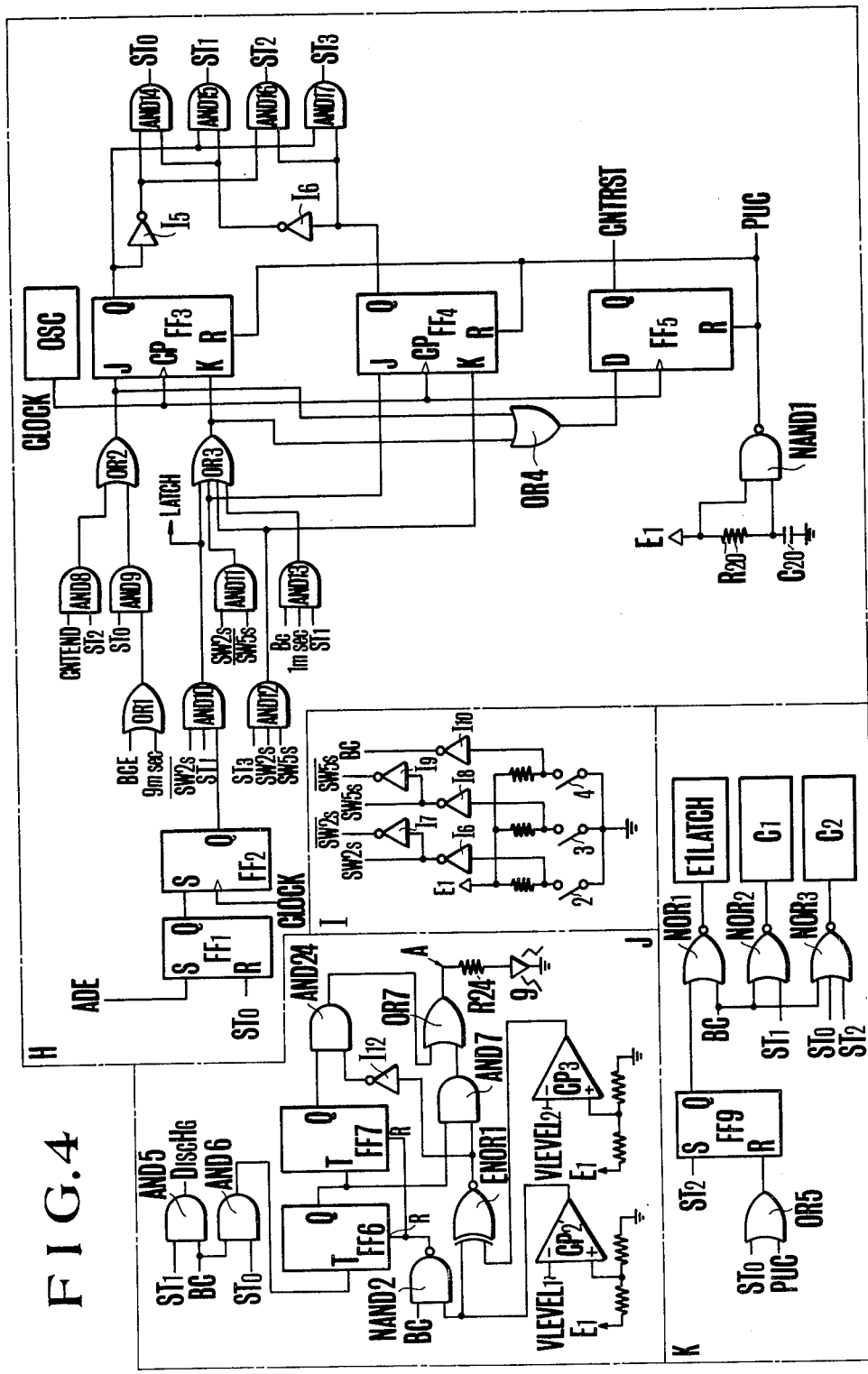
FIG. 4 is a circuit diagram showing the arrangement of a sequence control part of a logic integrated circuit shown in FIG. 2.
Figure 5:
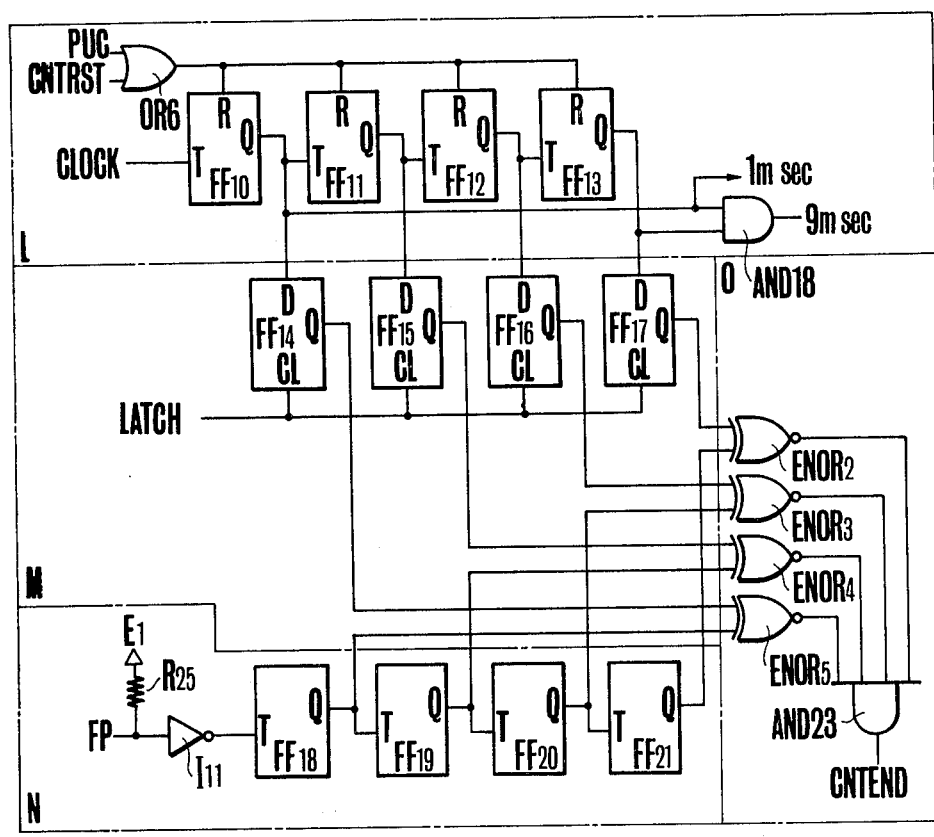
FIG. 5 is a circuit diagram showing the arrangement of an aperture control circuit part of the computing control integrated circuit shown in FIG. 2.

FIGS. 3, 4 and 5 are circuit diagrams showing the computing integrated circuit IC2 shown in FIG. 2 as an embodiment of the invention. In these drawings, a light measuring circuit A is composed of a known light measuring amplifier arrangement consisting of a light sensitive element 8, an operational amplifier MOS and a diode D1. There is provided an exposure information setting circuit B which is composed of a variable resistor VRAV0 for setting the full-open aperture value of a photo taking lens; an operational amplifier A5; an operational amplifier A6 having the inversion input terminal thereof connected through a resistor R2 to the inversion input terminal of another operational amplifier A1 which will be described hereinafter; and a transistor Tr2 which has the base thereof connected to the input terminal of the operational amplifier A6 and the emitter thereof connected to the inversion input terminal of the operational amplifier A6. The circuit B which is formed in this manner is arranged for setting a full-open aperture value. Another circuit C constitutes a computing part which is composed of operational amplifiers A1 and A2 and a variable resistor VRSv-Tv which is arranged for setting information values Sv and Tv based on shutter time information Tv and film sensitivity information Sv which are set by a shutter dial and a film sensitivity setting dial which are not shown, are operated. The computing circuit part C formed by these elements is arranged to compute information on brightness Bv, information on a full-open aperture value Avo and the information Sv-Tv set by the resistor VRSv-Tv and to produce an output corresponding to an aperture value Av. An input information switch-over circuit D is composed of a buffer amplifier A3-1 which is arranged to transmit the information Av received from the preceding circuit C to an integration circuit which will be described hereinafter; a buffer amplifier A3-2 which is arranged to produce a constant value KVc for inversely integrating the information integrated by the integration circuit; and an operational amplifier A3-3 which is arranged to have a potential of a connection point between bleeder resistors R13 and R14 impressed on the inverting input terminal thereof and to have a constant voltage Vc impressed on the non-inverting input terminal thereof. Analogue switches 5, 6 and 7 are arranged to be operatively controlled by AND gates AND-1–AND3, which will be described hereinafter. The output terminals of the amplifiers A3-1–A3-3 are connected through these switches 5, 6 and 7 to the integration circuit which will be described hereinafter. Further, these analogue switches are known switches and, for example, formed with FETs. Another circuit part E includes the integration circuit which forms a double integration type A-D converter jointly with a counter FF10–FF13 located in a circuit part L which will be described hereinafter; and a comparator CP2 which forms a part of a battery check circuit. In the circuit part E, an operational amplifier A4 is connected to the output terminals of the amplifiers A3-1–A3-3 through the above stated analogue switches 5, 6 and 7. The operational amplifier A4 has a capacitor C1 connected to the feedback line thereof to form a Miller integrating circuit. A comparator CO1 has one of the input terminals thereof connected to the output terminal of the Miller integrating circuit and has the constant voltage Vc impressed on the other input terminal thereof. The comparator CP1 is arranged to produce an A-D conversion completion signal upon completion of A-D conversion. A driving circuit F is arranged to drive a driving magnet Mg for driving an aperture control mechanism which is not shown. The driving circuit F is formed by a transistor Tr5 which has the base thereof connected to the output terminal of an AND gate AND4 and has the collector thereof connected to the above stated magnet Mg; and a Zener diode D2 which is connected between the collector and emitter of the transistor Tr5. The Zener diode D2 is arranged to prevent a spike signal produced by the magnet Mg. A signal transmission circuit G includes input terminals E1LATCH, C1 and C2 of a computing integrated circuit IC2 respectively connected to the output terminals E1LATCH, C1 and C2 of the logic integrated circuit IC1 shown in FIG. 2; inverters I1–I3; and AND gates AND1–AND4. The output terminal S1 of the AND gate AND1 is connected to the switch 5, the output terminal S2 of the AND gate AND2 to the above stated switch 6, the output terminal S3 of the AND gate AND3 to the above stated switch 7 and the output terminal SMg of the AND gate AND4 to the base of the transistor Tr5. A sequence control circuit 4 includes an RS flip-flop circuit FF1 having a set terminal thereof connected to the output terminal of the comparator CP1 of the circuit part E and the reset terminal thereof connected to the output terminal ST0 of the AND gate AND14; a D type flip-flop circuit FF2 having the D input terminal thereof connected to the output terminal Q of the flip-flop circuit FF1; AND gates AND-8–AND13; and OR gates OR1–OR4. The input terminals of these gates are connected to the output terminals of circuit elements indicated by reference symbols as shown in FIG. 4. The circuit part H further includes JK flip-flop circuits FF3 and FF4 for determining a sequence. The input terminal J of the flip-flop circuit FF3 is connected to the output terminal of the OR gate OR2 while the input terminal K of the flip-flop circuit FF3 is connected to the output terminal of the OR gate OR3. The input terminal J of the flip-flop circuit FF4 is connected to the output terminal of the AND gate AND11 while the input terminal K thereof is connected to the output terminal of the AND gate AND12. There are also provided inverters I5 and I6; AND gates AND-14–AND17 which have their input terminals connected to the output terminals Q of the flip-flop circuits FF3 and FF4 either directly or through the inverters I5 and I6; a D-type flip-flop circuit FF5 which has its input terminal D connected to the output terminal of the OR gate OR4 and its output terminal Q to one of the input terminals of an OR gate OR6; and a resistor R20, a capacitor C20 and a NAND gate NAND1 which jointly form a power up clear circuit. A circuit I is an input circuit including: The switches 2, 3 and 4 which are shown in FIG. 2 and inverters I6–I10 which are arranged to have their outputs determined by the on-off conditions of the switches 2–4.

A circuit J forms the battery check device arranged in accordance with the present invention. There are provided a comparator CP2' which is arranged to have a first setting voltage VLEVEL1 impressed on one of its input terminals (−) and a power source voltage E1 impressed through a bleeder resistor on the other input terminal (+), the above stated setting voltage VLEVEL1 being set at a voltage value required for operating the camera; another comparator CP3 which is arranged to a second setting voltage VLEVEL2 impressed on one input terminal (−) thereof and the power source voltage E1 impressed on the other input terminal (+) thereof through a bleeder resistor, the setting voltage VLEVEL2 being set at a higher value than the other setting voltage VLEVEL1; an AND gate AND5 having one input terminal connected to the output terminal ST1 of the AND gate AND15 and the other input terminal connected to the output terminal BC of the inverter I10 while the output terminal thereof being connected through resistors R11 and R12 to the bases of the transistors Tr3 and Tr4 of the above stated circuit part E; and another AND gate AND6 which has one input terminal thereof connected to the output terminal of the above stated inverter I10 and the other input terminal thereof connected to the output terminal ST0 of the above stated AND gate AND14 while the output terminal thereof is connected to the terminal T of a T-type flip-flop circuit FF6. This flip-flop circuit FF6 forms a frequency dividing circuit together with another flip-flop circuit FF7. Further, in the circuit part J, AND gates AND7 and AND24, a NAND gate NAND2, an exclusive NOR gate ENOR1, an inverter I12 and an OR gate OR7 constitute a selection circuit which selects an output terminal of the above stated frequency dividing circuit according to the outputs of the above stated comparators CP2' and CP3 and is arranged to drive a light emitting diode 9 with an output produced from the output terminal selected. In a circuit part K which is a signal transmission circuit, there is provided an OR gate OR5 which has one input terminal thereof connected to the output terminal ST0 of the above stated AND gate AND14 and the other input terminal thereof connected to the output terminal of the above stated power up clear circuit. The output terminal of the OR gate OR5 is connected to the reset terminal R of a flip-flop circuit FF9. Meanwhile, the set terminal S of the flip-flop circuit FF9 is connected to the output terminal of the above stated AND gate AND16. NOR gates NOR1–NOR5 have their output terminals connected to the terminals E1LATCH, C1 and C2 of a logic integrated circuit IC1. A circuit L is an A-D conversion and control counter circuit. In this circuit L, a counter is formed by flip-flop circuits FF10–FF13. An OR gate OR6 has one input terminal thereof connected to the above stated power up clear circuit and the other input terminal to the output terminal Q of the flip-flop circuit FF5. The output terminal of the OR gate OR6 is connected to the reset terminals R of the above stated flip-flop circuits FF10–FF13. An AND gate AND18 is connected to the output terminals of the flip-flop circuits FF10 and FF13. A circuit M is a latch circuit which is composed of flip-flop circuits FF14–FF17. Another circuit N is an aperture control counter circuit. The aperture control counter circuit N is composed of an inverter I11 and a counter formed by flip-flop circuits FF18–FF21. Meanwhile, a pulse forming means which is not shown is arranged to produce a number of pulses corresponding to an aperture value defined in association with an aperture control mechanism which is also not shown. The inverter I11 is arranged to have its input terminal receive the pulses FP produced by this pulse forming means.

A coincidence detection circuit O comprises exclusive NOR gates ENOR2–ENOR5 and an AND gate AND23.

Further, a pulse oscillator OSC which is provided within the circuit H is arranged to produce pulses at 1 KHz. The operation of the battery check circuit of the present invention shown in FIGS. 3, 4 and 5 is as follows.

In battery checking, the switch 4 of circuit I in FIG. 4 is turned on to turn on the switch 1' and the transistor Tr1 in turn. This energizes each of the circuits and makes the level of the output of the inverter I10 high (hereinafter will be called "1"). The signal "1" thus obtained is transmitted to the NOR gates NOR1–NOR3 to cause these NOR gates to produce outputs of a low level (hereinafter will be called "0"). The "0" signals thus produced are transmitted to the circuit G (in FIG. 3) through the terminals E1LATCH, C1 and C2 to cause the inverters I1–I3 to produce "1" signals. Then, the AND gates AND3 and AND4 produce "1" signals to turn on the transistor Tr5, to energize the magnet Mg and to turn on the switch 7. Since the transistor Tr1 is on as mentioned in the foregoing, at this time, the capacitor C20 is charged through the resistor R20 in the circuit H shown in FIG. 4. The NAND gate NAND1 produces a "1" signal which later becomes a "0" signal upon completion of charging of the capacitor C20. In other words, with the transistor Tr1 turned on, the NAND gate NAND1 produces pulses as a power up clear signal. The pulse signal thus produced is transmitted to the reset terminals R of the flip-flop circuits FF3–FF5 and also to the reset terminals R of the flip-flop circuits FF10–FF13 of the circuit L through the line PUC and the OR gate OR6. Therefore, in the circuit part L, the flip-flop circuits FF10–FF13 are reset while the flip-flop circuits FF3–FF5 of circuit H are also reset. With the flip-flop circuits FF3 and FF4 reset, the inverters I5 and I6 produce "1" signals to cause the AND gate AND14 to produce a "1" output.

Meanwhile, with the switch 7 (circuit D in FIG. 3) turned on as mentioned in the foregoing, the output of the amplifier A3-3 is received by the amplifier A4 to actuate the Miller integrating circuit which consists of the amplifier A4 and the capacitor C1 and the output of the amplifier A3-3 is integrated. Since the amplifier A3-3 has the power source voltage E1 impressed on its input terminal through the bleeder resistors R13 and R14, the output of the amplifier A3-3 is of a value corresponding to the power source voltage E1. Accordingly, the integrating speed of the Miller integrating circuit is determined in accordance with the power source voltage. With the Miller integrating being performed, when the output of the Miller integrating circuit reaches a predetermined voltage KVc, the comparator CP2 produces a "1" signal. Line BCE transmits the signal to the OR gate OR1 disposed within the circuit part H and then the "1" signal is transmitted to one of the input terminals of the AND gate AND9. Since the AND gate AND14 is producing an output "1" at this point of time as mentioned in the foregoing, the AND gate AND9 also produces a "1" signal which is then transmitted to the input terminal J of the flip-flop circuit FF3 through the OR gate OR2. This causes the output terminal Q of the flip-flop circuit FF3 to produce a "1" signal, which is impressed on one of the input terminals of the AND gate AND15. Meanwhile, since the output terminal of the flip-flop circuit FF4 maintains a "0" signal, the output terminal of the inverter I6 keeps on producing a "1" signal to have the "1" signal impressed also on the other input terminal of the AND gate AND15. This causes the AND gate AND15 to produce a "1" signal. Then, since the output of the inverter I5 changes from a "1" signal to a "0" signal, the "1" signal from the AND gate AND14 also changes to a "0" signal. In other words, the AND gate AND14 is arranged to produce a "1" signal until the integrating action of the Miller integrating circuit is completed. After completion of the integrating action, the AND gate AND15 produces a "1" signal.

With the "1" signal produced by the AND gate AND15, the "1" signal is transmitted to the AND gate AND5. Further, since the other input terminal of the AND gate AND5 is connected to the above stated inverter I10 of circuit I, the AND gate AND5 produces a "1" signal which is impressed on the bases of the transistors Tr3 and Tr4 disposed within the circuit part E shown in FIG. 3. The transistors Tr3 and Tr4 are then turned on to cause the capacitor C1 to discharge its electric charge. Then, the capacitor C1 is immediately brought back to its initial state. When the OR gate OR2 of circuit H produces a "1" signal to set the flip-flop circuit FF3 as mentioned in the foregoing, the "1" signal from the OR gate OR2 is transmitted through the OR gate OR4 to the input terminal D of the flip-flop circuit FF5 to set the flip-flop circuit FF5 in synchronism with the setting of the flip-flop circuit FF3. This causes the "1" signal produced from the flip-flop circuit FF5 to be transmitted through the OR gate OR6 to the reset terminals of the flip-flop circuits FF10–FF13 disposed within the circuit part L shown in FIG. 5. Then, the flip-flop circuits FF10–FF13 are set concurrently with the change of the output of the AND gate AND15 to "1". When the output of the AND gate AND15 becomes "1", the flip-flop circuit FF10 produces a "1" signal 1 ms after the change of the output of the AND gate AND15 to "1". The "1" signal thus produced by the flip-flop circuit FF10 is transmitted to one of the input terminals of the AND gate AND13 of circuit H in FIG. 4. Since the other input terminal of the AND gate AND13 is connected to the output terminals of the inverter I10 and the AND gate AND15 respectively, the AND gate AND13 produces a "1" signal, which is then transmitted through the OR gate OR3 to the input terminal K of the flip-flop circuit FF3. This causes the output of the output terminal Q of the flip-flop circuit FF3 to change from the "1" signal to a "0" signal. Accordingly, the output of the AND gate AND15 becomes "0" and the output of the AND gate AND14 again becomes "1". Therefore, the AND gate AND5 again produces a "0" signal to turn the transistors Tr3 and Tr4 off and to have the output of the amplifier A3-3 integrated again. The processes described in the foregoing are thus arranged to be performed in a repeating manner.

During the above stated operation, the length of time over which the AND gate AND14 produces a "1" signal is from the commencement of the integrating action of the integrating circuit to the time the output thereof reaches the predetermined voltage KVc. Then, since the integrating speed is determined by the power source voltage E1, the length of time over which the "1" signal is produced by the AND gate AND14 becomes shorter as the power source voltage increases. In other words, the cycle (i.e. a pulse cycle) during which the AND gate AND14 repetively produces the "1" signal is determined by the power source voltage and the pulses are produced at a higher frequency as the power source voltage increases.

While pulses are produced from the AND gate AND14 at a frequency corresponding to the power source voltage as mentioned above, the power source voltage E1 is received at the comparators CP2' and CP3 in circuit J through the bleeder resistor for comparison with the setting voltage values VLEVEL1 and VLEVEL2 respectively. When the power source voltage is sufficiently high, both the comparators CP2' and CP3 produce "1" signals. This causes the output of the exclusive NOR gate ENOR1 to become "1". This "1" signal is then transmitted through the inverter I12 to the AND gate AND24 in the form of a "0" signal. The AND gate AND24 then closes. Further, since the output of the exclusive NOR gate ENOR1 is also transmitted to the AND gate AND7, the AND gate AND7 opens. Therefore, the above stated pulses of frequency corresponding to the power source voltage are impressed on the light emitting diode to cause the light emitting diode to flicker at the same frequency. This is so because the output of the AND gate AND14 is impressed on the AND gate AND6, the output (pulses) of the AND gate AND14 is transmitted through the AND gate AND6 to the flip-flop circuit FF6. Since the flip-flop circuit FF6 forms a frequency dividing circuit jointly with another flip-flop circuit FF7, the flip-flop circuit FF6 produces pulses at the same frequency as the pulse output of the AND gate AND14. Accordingly, the pulse output of the flip-flop circuit FF6 is transmitted through the AND gate AND7 and the OR gate OR7 to the light emitting diode to cause it to flicker, so that the value of the power source voltage can be displayed by flickering of the light emitting diode 9 at frequency corresponding to the power source voltage.

Figure 1A:
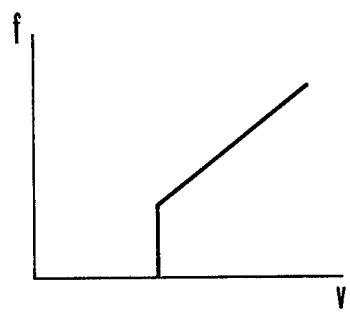
FIG. 1(a) is a wave form chart showing the operation of the conventional battery check device.

While the above stated operation takes place when the power source voltage is higher than the level of the setting voltage VLEVEL2, the system of the present invention operates in the following manner when the power source voltage is between the setting voltage levels VLEVEL2 and VLEVEL1: In this case, the comparator CP2' produces a "1" signal. However, the other comparator CP3 produces a "0" signal. Therefore, the exclusive NOR gate ENOR1 produces a "0" signal. This opens the AND gate AND24 and closes the AND gate AND7. Accordingly, in this case, the light emitting diode is caused to flicker by the output of the flip-flop circuit FF7. Then, the diode flickers at frequency which is ½ of the frequency obtained when the power source voltage is higher than the level VLEVEL2. Assuming that the flickering frequency when the power source voltage is slightly higher than the level VLEVEL2 (that is, the frequency of the flip-flop FF6) is 2 $f_2$ as shown in FIG. 1(b), the flickering frequency becomes $f_2$ when the power source voltage becomes lower than the level VLEVEL2, because the light emitting diode flickers at the output frequency of the flip-flop circuit FF7 instead of that of the flip-flop circuit FF6. Thus, the flickering frequency in this case decreases stepwise to clearly let the photographer know that the residual voltage capacity of the power source has become less than the setting voltage value VLEVEL2.

Further, when the power source voltage becomes lower than the other setting voltage VLEVEL1, the comparator CP2' produces a "0" signal. Then, the NAND gate NAND2 produces a "1" signal to reset the flip-flop circuits FF6 and FF7 and the light emitting diode comes to be in an extinguished state to let the photographer clearly know that photo taking is no longer possible because the power source voltage is below the setting voltage VLEVEL1.

Thus, in the battery check device of the present invention, the flickering frequency of the light emitting diode gradually changes with the power source voltage when the power source voltage is above the setting voltage VLEVEL2; the flickering frequency drops stepwise when the power source voltage becomes lower than the setting voltage VLEVEL2 and then again gradually changes with the power source voltage while it is between the two setting voltage values VLEVEL2 and VLEVEL1; and the flickering state of the light emitting diode changes to an extinguished state when the power source voltage becomes lower than the setting voltage VLEVEL1. The photographer can be allowed by this arrangement to clearly know the state of the residual capacity of the power source voltage.

In the battery checking operation described above, since the magnet Mg is energized then, a voltage under a condition of having a current flowing to a load is detected, so that voltage detection can be accurately performed. Further, while the magnet is thus energized, the aperture control mechanism is kept in an inoperative state, because no release operation is performed during a battery checking operation.

Next, the exposure control operation of the circuits shown in FIGS. 2, 3, 4 and 5 is as follows. When, a release button which is not shown is depressed, the release operation turns the first stroke switch 1 on. Then, the transistor Tr1 is turned on in turn to have power supply commenced to each circuit. The NAND gate NAND1 produces a pulse output to reset the flip-flop circuits FF3, FF4 and FF5 in the same manner as in the foregoing description. This causes the AND gate AND14 to produce a "1" signal in the same manner as in the foregoing. The output of the NOR gate NOR3 becomes "0". The output "0" is produced from the terminal C2. The inverter I3 produces a "1" signal, which is transmitted to one of the input terminals of the AND gate AND1. Meanwhile, since the terminals E1-LATCH and C1 are producing "1" signals at this point of time, the AND gate AND1 produces a "1" signal.

The switch 5 is turned on by this and the output of the amplifier A3-1 is impressed on the input terminal of the Miller integrating circuit. The output of the amplifier A3-1 is aperture value information based on the information on brightness, the max. F number, film sensitivity and shutter time received from the circuit parts A, B and C. The aperture value information thus obtained is integrated at the Miller integrating circuit. While an integrating action is initiated at the Miller integrating circuit in this manner, the counter which is formed by the flip-flop circuits FF10—FF13 disposed within the circuit part L shown in FIG. 5 counts clock pulses coming from the pulse oscillator OSC in a cycle of 1 ms. The AND gate AND18 produces a "1" signal when the outputs of the flip-flop circuits FF13 and FF10 become "1", that is, 9 msec after the commencement of the integrating action of the Miller integrating circuit. This "1" signal is transmitted to the AND gate AND9 through the OR gate OR1. Since the AND gate 14 is then producing the "1" signal as mentioned in the foregoing, the AND gate AND9 produces a "1" signal in response to the "1" signal from the OR gate OR1. The output "1" of the AND gate AND9 is transmitted through the OR gate OR2 to the input terminal J of the flip-flop circuit FF3. This causes the flip-flop circuit FF3 to produce a "1" signal from its output terminal Q. The "1" signal from the AND gate AND14 changes to a "0" signal while a "1" signal is produced from the AND gate AND15. Further, the "1" signal from the above stated OR gate OR2 is transmitted through the OR gate OR4 to the input terminal D of the flip-flop circuit FF5 and a "1" signal is produced from the output terminal Q of the flip-flop circuit FF5. When the output of the AND gate AND14 becomes "0" and the AND gate AND15 becomes "1" in this manner, the NOR gate NOR2 produces an output "0" and the NOR gate NOR3 an output "1". The "1" signal from the AND gate AND1 in the circuit part G becomes "0" and, in place of this, a "1" signal is produced from the AND gate AND2. Therefore, the switch 5 is turned off and the switch 6 is turned on to have the predetermined voltage KVc impressed on the Miller integrating circuit and there takes place a reverse integrating action. With the reverse integrating action commenced in this manner, the output of the Miller integrating circuit gradually decreases. When the output of the Miller integrating circuit becomes lower than the predetermined voltage Vc, the output of the comparator CP1 becomes "1" to set the flip-flop circuit FF1 which is disposed within the circuit part H. The output terminal Q of the flip-flop circuit FF2 then produces a "1" signal to have it impressed on one of the input terminals of the AND gate AND10. Since the outputs of the AND gate AND15 and the inverter I7 at this point of time are "1" as mentioned in the foregoing, the AND gate AND10 produces a "1" signal. The "1" signal from the AND gate AND10 is impressed on the clock input terminals CL of the flip-flop circuits FF14–FF17 disposed within the circuit part M to have the contents of the counter of the circuit part L latched at the latch circuit which is formed by these flip-flop circuits FF14–FF17. As mentioned in the foregoing, since a "1" signal is produced from the output terminal Q of the flip-flop circuit FF5 when the reverse integrating action begins at the Miller integrating circuit, the flip-flop circuits FF10–FF13 have been reset at the time of commencement of the reverse integrating action at the Miller integrating circuit. Therefore, the flip-flop circuits FF10–FF13 are in their initial state when the reverse integrating action begins and a counting action has been started there from the initial state. Accordingly, the content of the flip-flop circuits FF10–FF13 which is latched at the latch circuit is a value counted during a length of time required for the reverse integrating action and is a value corresponding to an aperture value. In other words, there is performed an analogue-to-digital conversion by a known double-integrating action to have a digital value latched at the latch circuit. While the analogue-to-digital conversion is performed to have a digital aperture value latched at the latch circuit in this manner, the above stated "1" signal from the AND gate AND10 is transmitted to the input terminal K of the flip-flop circuit FF3 through the OR gate OR3 to reset the flip-flop circuit FF3. This causes the output terminal Q of the flip-flop circuit FF3 to produce an output "0" to cause the output of the AND gate AND15 to change from "1" to "0". The output of the AND gate AND14 then again becomes "1". With the output of the AND gate AND14 becoming "1", again the above stated operation takes place to have the integrating action on the aperture value signal commenced. The operation described in the foregoing is thus performed in a repeating manner. During the repeated process of digital conversion of the aperture value, when the shutter button which is not shown is depressed further, the switch 2 is turned on. This causes the inverter I6' to produce an output "1". This "1" signal is transmitted to one of the input terminals of the AND gate AND11. Since the inverter I9 is producing a "1" signal then, the further depression of the shutter button causes the AND gate AND11 to produce a "1" signal, which is transmitted to the input terminal J of the flip-flop circuit FF4 and is also transmitted to the input terminal K of the flip-flop circuit FF3 through the OR gate OR3. With the "1" signal impressed on the input terminal K of the flip-flop circuit FF3 and on the input terminal J of the flip-flop circuit FF4, the output terminal Q of the flip-flop circuit 3 produces an output "0" and the output terminal Q of the flip-flop circuit produces an output "1". The AND gate AND16 then produces a "1" signal. The "1" signal from the AND gate AND16 comes to the set terminal of the flip-flop circuit FF9 to set it and the NOR gate NOR1 produces a "0" signal. Further, the "1" signal from the AND gate AND16 comes also to the NOR gate NOR3 to cause it to produce a "0" signal. The "0" signals from the NOR gates NOR1 and NOR3 are transmitted through the terminals E1LATCH and C2 to the circuit part G to cause the inverters I1 and I3 to produce "1" signals. Then, the AND gate AND4 produces a "1" signal. The "1" signal from the AND gate AND4 turns on the transistor Tr5 to permit power supply to the magnet Mg. The magnet Mg then causes the aperture control mechanism which is not shown to operate to commence an aperture control action. With the aperture control mechanism actuated in this manner, the pulse forming means which is not shown produces a number of pulses FP corresponding to an aperture value defined by the aperture control action. The pulses thus produced are counted at the circuit part N. During the process of counting the pulses FP at the counter disposed in the circuit part N, when the content of the counter coincide with the content of the latch circuit, the AND gate AND23 of the coincidence detection circuit disposed within the circuit part O produces a "1" signal and the AND gate AND8 also produces a "1" signal. The "1" signal thus produced is transmitted through the OR gate OR2 to the input terminal J of the flip-flop circuit FF3 to cause the output terminal Q of the flip-flop circuit to produce a "1" signal. This in turn causes the AND gate AND17 to produce a "1" signal. The "1" signal of the AND gate AND16 then becomes "0". The output of the NOR gate NOR3 becomes "1". The AND gate AND4 which is disposed in the circuit part G produces a "0" signal. The transistor Tr5 is turned off to bring the magnet Mg into a non-excited state. This in turn bring the aperture control action by the aperture control mechanism to an end. The aperture is set. After that, shutter control is performed at a setting value of the shutter time to effect exposure control.

Figure 6:
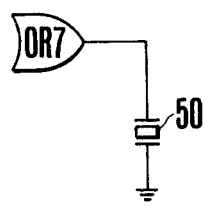
FIG. 6 is a circuit diagram showing an example of the display element employed in the battery check device of the present invention.
Figure 7:
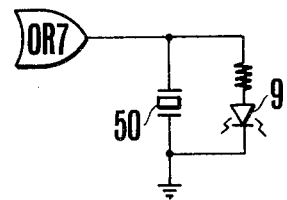
FIG. 7 is a circuit diagram showing another example of the display element employed in the battery check device of the invention.

In the embodiment shown in FIG. 4 and described in the foregoing, the result of battery checking is displayed by means of a light emitting diode, the use of the light emitting diode may be of course replaced with some other suitable means such as a ceramic sound emitting element 50 or a combination of the ceramic sound emitting element and the light emitting diode 9 as shown in FIGS. 6 and 7 for an audible display or an audible-and-visible display.

As mentioned in the foregoing, in the invented battery check device, the oscillation frequency is gradually changed along with the level of the power source voltage; and, when the power source voltage becomes lower than a predetermined level, the above stated frequency is changed in a stepwise manner to enable the photographer to clearly know the residual capacity of the battery in use as power source. This is a great advantage for a battery check device.

What is claimed is:

1. A power source check device for a camera, said device comprising:
    (a) a signal forming circuit arranged to produce a signal having a frequency corresponding to the voltage of a power source;
    (b) power source voltage level detecting means for detecting the level of said power source voltage, said detecting means being arranged to produce a signal when the voltage of the power source reaches a given relation to a predetermined level;
    (c) a control circuit coupled to said signal forming circuit, said control circuit being arranged to change the frequency of the signal produced by said signal forming circuit in response to the signal from said detecting means stepwise for a prescribed amount; and
    (d) indicating means arranged to be driven at the frequency of the signal produced by said signal forming circuit.

2. A power source check device for a camera, said device comprising:
    (a) a signal forming circuit arranged to produce a signal having a frequency corresponding to the voltage of a power source;
    (b) a frequency dividing circuit arranged to divide the frequency of said signal produced by said signal forming means, said dividing circuit having a first mode to divide the frequency of the signal by a first value and produces as an output the signal of said frequency divided by the first value, and a second mode to divide the frequency of the signal by a second value and to produce as an output the signal of said frequency divided by the second value;
    (c) power source voltage level detecting means for detecting the level of said power source voltage, said detecting means being arranged to produce a signal when the power source voltage reaches a given relation to a predetermined level;
    (d) a control circuit coupled to said frequency dividing circuit, said control circuit being arranged to change the frequency dividing value of said frequency dividing circuit from a first value to a second value in response to the signal produced by said detecting means; and
    (e) indicating means arranged to be driven according to the control signal produced by said frequency dividing circuit.

3. A power source check device as in claim 2, wherein
    (f) said frequency dividing circuit includes a first output terminal connected to carry the signal divided by the first value and a second output terminal connected to carry the signal divided by the second value; and
    (g) said control circuit having selection means for selection of one of the output terminals of said frequency dividing circuit, said selection means being arranged to select one of the output terminals according to the level of said power source voltage for driving the indicating means.

4. A power source check device comprising:
    (a) a signal forming circuit arranged to produce a pulse signal of a frequency corresponding to the voltage of a power source;
    (b) a frequency dividing circuit arranged to divide the frequency of said pulse signal, said frequency dividing circuit having first and second output terminals;
    (c) level detecting means for detecting the level of the power source voltage, said detecting means being arranged to produce a first signal when the power source voltage is above a predetermined level and to produce a second signal when said power source voltage is lower than said predetermined level;
    (d) a selection circuit for selection of one of the output terminals of said frequency dividing circuit, said selection circuit being arranged to select said first output terminal in response to said first signal produced by said detecting means and to select said second output terminal in response to said second signal produced by said detecting means; and
    (e) indicating means arranged to be driven in response to a pulse signal at the selected one of said output terminals.

5. A power source check device comprising:
    (a) a signal forming circuit having a first mode in which the signal forming circuit generates a signal of a frequency that continuously changes with a variation in the voltage level of a power source within a first range when the power source voltage is within a first range, and having a second mode in which the signal forming circuit generates a signal of a frequency that changes over a prescribed amount in a stepwise manner relative to the frequency within the first range when the voltage is within a second range;
    (b) power source voltage level detecting means for detecting the level of the voltage of the power source and for actuating the signal forming circuit to operate in the first mode when the voltage level is within the first range, and at the same time to activate the signal forming circuit to operate in the second mode when the voltage level is within the second range; and (c) indicating means arranged to be driven according to the signal produced by said signal forming circuit.

6. A power source check device comprising:
(a) a signal forming circuit arranged to produce a signal of a frequency corresponding to the voltage of a power source;
(b) a frequency dividing circuit arranged to divide the frequency of said signal produced by said signal forming means;
(c) power source voltage level detecting means for detecting the level of the voltage of the power source, said detecting means being arranged to produce a signal when the voltage of the power source drops below a predetermined level;
(d) a control circuit coupled to said frequency dividing circuit, said control circuit being arranged to change the frequency dividing ratio of said frequency dividing circuit from a first ratio to a second ratio in response to the signal produced by said detecting means; and
(e) indicating means arranged to be driven according to the signal produced by said frequency dividing circuit.

7. A power source check device comprising:
(a) a signal forming circuit arranged to produce a pulse signal having a frequency corresponding to the voltage of a power source;
(b) a frequency dividing circuit arranged to divide the frequency of said pulse signal, said frequency dividing circuit having first and second output terminals;
(c) level detecting means for detecting the level of the power source voltage, said detecting means being arranged to produce a first signal when the voltage of the power source is above a predetermined level and to produce a second signal when the voltage of the power source is lower than said predetermined level;
(d) a selection circuit for selection of one of the output terminals of said frequency dividing circuit, said selection circuit being arranged to select said first output terminal in response to said first signal produced by said detecting means and to select said second output terminal in response to said second signal produced by said detecting means; and
(e) display means arranged to be driven in response to a pulse signal of the selected one of said output terminals,
(f) said frequency dividing circuit being arranged to produce one frequency at the first terminal and another frequency which is an integral divisor of the one frequency at the second terminal.

8. A battery check device for a camera, comprising:
detecting means for detecting whether the voltage of a battery is at and below a first level, between the first level and a second higher level, and at and higher than the second level;
signal forming means responsive to said detecting means for producing a first signal having a frequency A when the voltage is below the first level, a second signal having a frequency B a step function higher than the frequency A when the voltage is at the second level, and a signal having a frequency C a step function higher than the frequency of the second signal when the voltage is above the second level; and
indicating means for sensibly indicating the signal from said signal forming means.

9. A device as in claim 8, wherein the frequency C is twice the frequency B.

10. A device as in claims 8 or 9, wherein the first frequency is zero and said signal forming means extinguish said indicating means when the voltage is below the first level.

11. A device as in claim 10, wherein said indicating means is visual.

12. A device as in claim 10, wherein said indicating means is audible.

13. A device as in claims 1, 2, 4, or 5, wherein said indicating means is visual.

14. A device as in claims 1, 2, 4, or 5, wherein said indicating means is audible.

* * * * *